United States Patent [19]

Matsumura

[11] Patent Number: 4,656,432

[45] Date of Patent: Apr. 7, 1987

[54] FM DETECTOR WITH IMPROVED DISTORTION AND GAIN CHARACTERISTICS

[75] Inventor: Sumitaka Matsumura, Tokorozawa, Japan

[73] Assignee: Pioneer Electronic Corporation, Tokyo, Japan

[21] Appl. No.: 791,164

[22] Filed: Oct. 24, 1985

[30] Foreign Application Priority Data

Oct. 25, 1984 [JP] Japan ................... 59-224344

[51] Int. Cl.$^4$ .................. H03D 3/04; H03D 3/06
[52] U.S. Cl. .................... 329/107; 329/112; 329/126; 329/133; 329/145; 375/80; 455/214
[58] Field of Search ............. 329/103, 107, 110, 112, 329/126, 133, 137, 145; 455/214; 375/80, 94

[56] References Cited

U.S. PATENT DOCUMENTS 3,991,377 11/1976 Salazar et al. ............. 329/124 X
4,506,228 3/1985 Kammeyer ................ 329/107

FOREIGN PATENT DOCUMENTS 56-56008 5/1981 Japan .................... 329/122

Primary Examiner—Siegfried H. Grimm
Attorney, Agent, or Firm—Fleit, Jacobson, Cohn & Price

[57] ABSTRACT

An FM detector includes a Hilbert transforming means and a pair of detector circuits which respectively detect an input FM signal and a Hilbert transform of the input FM signal produced by the Hilbert transforming circuit. Output signals of the two detector circuits are applied to a combining circuit, such as an adder circuit, to provide a detection output signal. With this construction, a second harmonic component which is inevitably produced during the detection operation is cancelled, so that a detector output signal, free of the so-called Aliasing distortion, is obtained even if an overlap between the baseband component and the second harmonic component occurs. Further, the gain characteristic of the detector is greatly improved.

14 Claims, 6 Drawing Figures

FM DETECTOR WITH IMPROVED DISTORTION AND GAIN CHARACTERISTICS

BACKGROUND OF THE INVENTION

1. Field of the Invention

The present invention relates to an FM detector for detecting an FM (frequency modulated) signal, to reproduce an original signal.

2. Description of Background Information

In the field of FM demodulation, various methods have been proposed for demodulating an FM signal, especially a digitalized FM signal. For instance, techniques in this field are discussed in abstracts for a national meeting of Japan Electronics and Communication Society, Communication section, held in 1980, in an article No. S5-8 entitled "A study of various methods for constructing an FM detector of DSP (digital signal processing) type". The article concludes that, among the methods described, the quadrature detection is most suited for the application of LSI (large scaled integrated circuit) technique in view of its relatively simple construction and high performance.

However, in quadrature detection circuits a second harmonic component is inevitably produced. Therefore, in prior art circuits, it was necessary to determine each parameter of FM modulation such as the angular frequency of the FM signal, and the deviation of the angular frequency, so that the second harmonic component does not overlap the frequency bandwidth of the baseband component. In cases where the angular frequency is relatively low with respect to the bandwidth of the baseband component in such cases as the FM modulation of the video tape recorders or video discs, bandwidths of the baseband component and the second harmonic component become very close, in frequency, with each other. Therefore, a filter having very sharp frequency cut-off characteristic, and usually many filter stages have been required for separating the baseband component in conventional design. In addition, if an off-set of the angular frequency toward the high frequency side occurs, it has resulted in generation of the so-called Aliasing distortion due to an overlap between the second harmonic component and the baseband component.

OBJECT AND SUMMARY OF THE INVENTION

An object of the present invention is therefore to provide an FM detector which is capable of detecting an input FM signal without causing an increase of distortion, even if an overlap of a second harmonic component on a baseband component occurs. Another object of the present invention is to provide an FM detector having a greatly improved S/N ratio.

According to the present invention, an FM detector includes a transforming circuit for performing a Hilbert transformation of an input FM signal and a pair of detection circuits. One of the detection circuits is supplied with a Hilbert trarnsform of the input FM signal through the transforming circuit and the other is supplied with the input FM signal without passing through the transforming circuit. Output signals of the two detection circuits are supplied to a combining circuit where second harmonic components contained in the output signals of the detection circuits are cancelled with each other.

DETAILED DESCRIPTION OF THE PREFERRED EMBODIMENT

Figure 3:
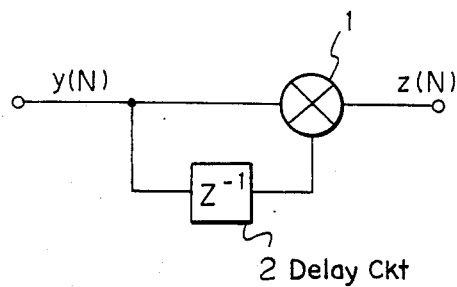
FIG. 3 is a block diagram showing an example of conventinal FM detector of quadrature detector type.

Before entering into the explanation of the embodiment of the present invention, reference is first made to FIG. 3 in which the construction of a conventional FM detector circuit is illustrated.

As shown, in the conventional quadrature detector, an input signal is applied to a delay circuit 2 for delaying the input signal for one sampling period and multiplied, at a multiplying circuit 1, with the input signal without any delay.

Suppose $\chi(t)$ ($|\chi(t)| \leq 1$) is an original signal, $\omega c$ is an angular frequency of an FM carrier signal, and $\Delta \omega$ is a deviation of the angular frequency, the FM signal $y(t)$ is expressed as:

$$y(t) = \cos\left(\omega c \cdot t + \Delta\omega \cdot \int_0^t \chi(t)\, dt\right). \tag{1}$$

Let $\phi(t) = \Delta\omega \cdot \int_0^t \chi(t)\, dt$, then $$y(t) = \cos(\omega c \cdot t + \phi(t)). \tag{2}$$

If the sampling is effected at constant intervals of $\Delta t$, then $$y(n\cdot\Delta t) = \cos(\omega c \cdot \Delta t \cdot n + \phi(n\cdot\Delta t)). \tag{3}$$

Substitution of the value $n\cdot\Delta t$ into $N$, and $\omega c \cdot \Delta t$ into $Wct$ yields $$y(N) = \cos(Wct\, N + \phi(N)). \tag{4}$$

It follows that an output signal $z(N)$ of the multiplier as an element of the quadrature detector circuit is expressed as:

$$\begin{aligned}z(N) &= y(N) \cdot y(N-1) \\ &= \cos(Wct\, N + \phi(N)) \cdot \cos(Wct\, N - Wct + \phi(N-1)) \\ &= [\cos\{2 \cdot Wct\, N + \phi(N) + \phi(N-1) - Wct\} + \\ &\quad \cos\{\phi(N) - \phi(N-1) + Wct\}]/2\end{aligned} \tag{5}$$

Suppose that the relation between the angular frequency $\omega c$ of the carrier signal and the sampling interval $\Delta t$ is $$\omega c \cdot \Delta t = \pi/2 + 2\cdot m \cdot \pi \tag{6}$$

($m = 0, 1, 2, \ldots$),
Equation (5) consequently gives $$z(N) = [-\sin\{2Wct\, N + \phi(N) + \phi(N-1)\} + \sin\{\phi(N) - \phi(N-1)\}]/2. \quad (7)$$

In the above equation, the second term of the right member represents a baseband component of the detector output signal, and the first term represents a second harmonic of the angular frequency $2\omega c$ generated by the multiplication and its side band components (hereinafter, the signal including the side band components will be referred to as the second harmonic).

Suppose a differentiated value $\phi'(N)$ of $\phi(N)$ can be approximated by $(\phi(N) - \phi(N-1))/\Delta t$, then the baseband component of the equation (7) will become:

$$\sin\{\phi(N) - \phi(N-1)\} \div \sin(\Delta t \cdot \phi'(N)) = \sin(\Delta t \cdot \Delta\omega \cdot \chi(N)) \quad (8)$$

From the foregoing, we can conclude that the original signal can be extracted by filtering the baseband component.

Further, linearity of the signal can be improved by supplying the filtered signal to a circuit performing an inverse function of sine. This point is described in detail in a paper entitled "An improvement in distortion characteristic of a quadrature FM detector using digital signal processing techniques" in the Journal of Japan Electronics and Communication Society, Feb. 1983, vol. 1, J-66-B, No. 2, pp 259-260.

In the quadrature detection, the above mentioned second harmonic components are necessarily produced, in principle, in both cases of an analog signal and a digital signal as the input signal. Therefore, various parameters of the FM signal, such as an angular frequency $\omega c$, and a deviation $\Delta\omega$ of the angular frequency are so determined that the second harmonic component would not overlap the frequency of baseband, or otherwise, the overlap region will become the smallest.

Figure 4:
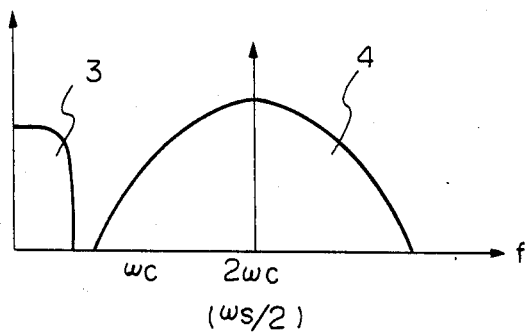
FIGS. 4 and 5 are diagrams showing frequency spectra of the conventional FM detector shown in FIG. 3.

However, in cases where the angular frequency $\omega c$ of the FM signal is low relative to the bandwidth of baseband as in the case of FM modulation in video tape recorders or video discs, the harmonic component 4 and the baseband component 3 will become too close in frequency with each other as typically illustrated in FIG. 4. Consequently, a filter having a sharp frequency cut-off characteristic is required for separating the baseband component. Further, as a result, many stages for example in multistage filter have been required.

The conventional technique will be further explained mathematically hereinafter.

Supposing that the value of m in the equation (6) which is the condition of quadrature detection, is equal to zero, we have $$\omega c \cdot \Delta t = \pi/2.$$

The equation reduces to $$\Delta t = \pi/2 \cdot \omega c.$$

Let $\omega s$ be the frequency of sampling, then $$2\pi/\Delta t = \omega s = 4 \cdot \omega c \quad (9)$$

Figure 5:
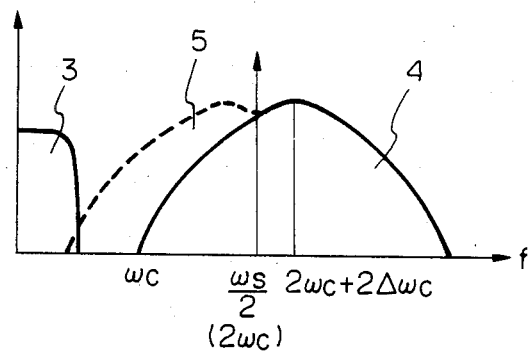

Therefore, $2 \cdot \omega c = \omega s/2$. This means that a center of the second harmonic component becomes a turnover frequency of the sampling. If, for instance, the angular frequency is off-set to the higher side by an amount of $\Delta\omega c$, then a problem of the so called aliasing distortion, i.e. an overlapping of the turned over component 5 on the baseband component 3 occurs as illustrated in FIG. 5. This has been causing great deterioration of the S/N ratio.

Figure 1:
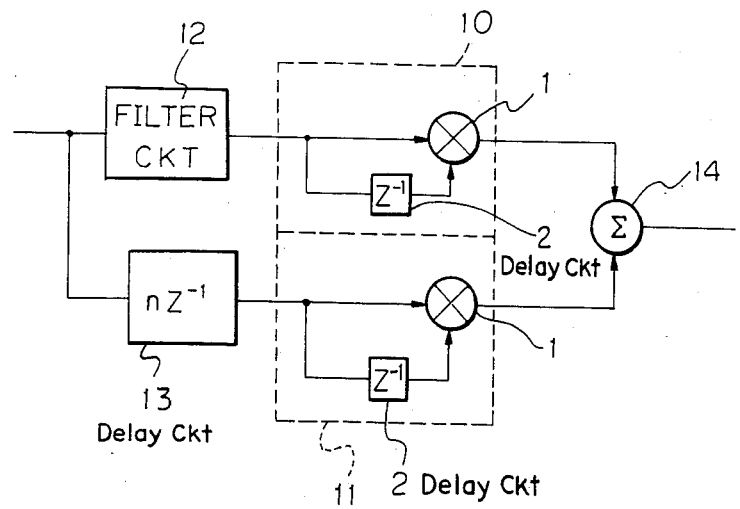
FIG. 1 is a block diagram of an embodiment of the FM detector according to the present invention.

Referring to FIG. 1, the embodiment of the present invention will be explained hereinafter.

As shown, the FM detector includes a pair of quadrature detection circuits 10 and 11 which include a delay circuit and a multiplying circuit as in the case of the quadrature detection circuit shown in FIG. 3. The detection circuit further includes a filter circuit 12 as means for effecting the Hilbert transformation of an input digital signal, and a delay circuit 13 for delaying the input signal by a period of n times of sampling. The time delay effected by the delay circuit 13 is corresponding to the delay time of the filter circuit 12. Output signals of the quadrature detection circuits 10 and 11 are added together at an adder circuit 14.

The operation of the FM detector circuit according to the present invention will be explained hereinafter.

Assume that the input digital FM signal is expressed by the equation (4), a signal $\hat{y}(N)$ obtained by the Hilbert transforming circuit 12 becomes $$\begin{aligned} \hat{y}(N) &= \cos(Wct\, N + \phi(N) + \pi/2) \\ &= \sin(Wct\, N + \phi(N)). \end{aligned} \quad (10)$$

An output signal $\hat{z}(N)$ of the quadrature detection circuit 10 which effects the detection of the y(N) after the Hilbert transformation, becomes $$\begin{aligned} \hat{z}(N) &= \hat{y}(N) \cdot \hat{y}(N-1) \\ &= \sin(Wct\, N + \phi(N))\sin(Wct \cdot N + \phi(N-1) - Wct) \\ &= [-\cos\{2\, Wct\, N + \phi(N) + \phi(N-1) - Wct\} \\ &\quad + \cos\{\phi(N) - \phi(N-1) + Wct\}]/2. \end{aligned} \quad (11)$$

On the other hand, an output signal z(N) of the quadrature detection circuit 11 which receives the input FM signal according to the equation (4) is expressed by the equation (5). By comparing the equations (5) and (11), it will be seen that the term of baseband component has the same phase in these equations. To the contrary, the term of the second harmonic component is in opposite phase with each other in these equations (5) and (11). Therefore, by adding the output signals of the quadrature detectors 10 and 11 at the adder circuit 14, an output signal $za(N)$ becomes:

$$\begin{aligned} za(N) &= z(N) + \hat{z}(N) \\ &= \cos\{\phi(N) - \phi(N-1) + Wct\} \\ &= \sin\{\phi(N) - \phi(N-1)\}. \end{aligned} \quad (12)$$

Thus, the second harmonic component is cancelled and only the baseband component is obtained at an output terminal of the adder circuit 14. Moreover, the output signal $za(N)$ has a level twice as high as the level of $z(N)$ or $\hat{z}(N)$. In this way, the FM detector according to the present invention is advantageous also in that an overall gain characteristic through the detector is greatly improved as compared with conventional detection circuits.

Figure 2:
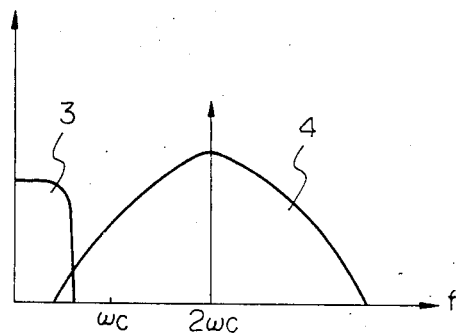
FIG. 2 is a diagram showing frequency spectra of the FM detector shown in FIG. 1.
Figure 6:
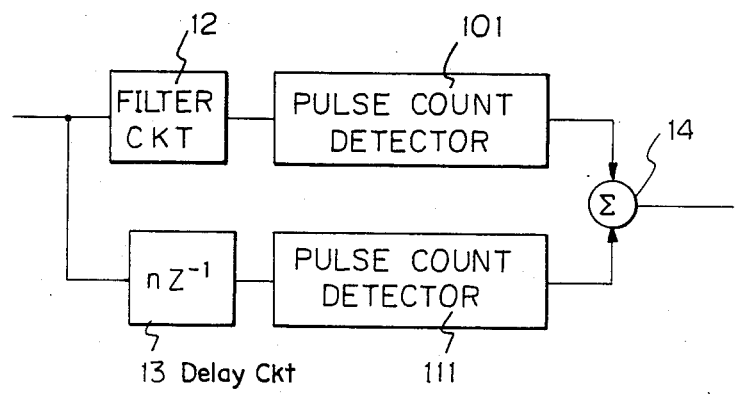
FIG. 6 is a block diagram showing a variation of the FM detector according to the present invention.

In the above embodiment, explanation has been made by way of an example where the turned over component of the second harmonic due to the sampling angular frequency of $\omega s$ enters into the frequency range of the baseband component. However, the present invention is not limited to this, and the FM detection is also possible where the parameters of FM detection are so determined that the baseband component 3 and the second harmonic component 4 overlap with each other in spectrum, as illustrated in FIG. 2. This means that an FM signal having a broader bandwidth can be recorded on a recording medium with a limited bandwidth. Also, although the above explanation has been made by way of example of digital FM signal, it is needless to say that the same effects can be obtained when the technique of the present invention is applied to the detection of an analog signal. Furthermore, the present invention is applicable to a pulse count detection circuit which includes a second harmonic component in an output signal thereof. Further, it is to be noted that there are number of variations of the FM detector according to the present invention, including the above variation using pulse count detectors which is illustrated in FIG. 6. In FIG. 6, the reference numerals 101 and 111 denote pulse count detectors, and other parts of the FM detector are the same as the embodiment of FIG. 1.

Thus, according to the present invention, an FM detector circuit is constructed such that a signal representing the Hilbert transform of an FM input signal and a signal without passing through the Hilbert transformation are detected respectively to yield two detection signals. In one of the two detection signals, the second harmonic component is in phase with the baseband component, and in the other the second harmonic component is anti-phase with the baseband component. The second harmonic component is cancelled by an operation between the thus obtained two detection signals. In this way, the second harmonic component is prevented from being mixed into the baseband component. Consequently, the detection is enabled even if the bandwidths of the second harmonic component and the baseband component are overlapped with each other, and further the S/N ratio of the detected signal is by far improved as compared with that in conventional techniques.

What is claimed is:

1. An FM detector for detecting an input FM signal comprising:
    a transforming means for effecting a Hilbert transformation of the input FM signal;
    a first detection means for detecting an output signal of said transforming means;
    a second detection means for detecting the input FM signal; and
    a combining circuit means for combining said output signals of said first and second detection means, to provide a detector output signal.

2. An FM detector as set forth in claim 1 further comprising a delay means for delaying the input FM signal being supplied to said operation circuit means through said second detection means, by a delay time corresponding to a time period required for effecting the Hilbert transformation by said transforming means.

3. An FM detector as set forth in claim 1, wherein said first and second detection means are quadrature detection means.

4. An FM detector as set forth in claim 2, wherein said first and second detection means are quadrature detection means.

5. An FM detector as set forth in claim 3, wherein said quadrature detection means comprises a delay circuit means for delaying an input signal and a multiplier means for multiplying an output signal of said delay means and said input signal.

6. An FM detector as set forth in claim 4, wherein said quadrature detection means comprises a delay circuit means for delaying an input signal and a multiplier means for multiplying an output signal of said delay means and said input signal.

7. An FM detector as set forth in claim 1, wherein said first and second detection means are pulse count detection means.

8. An FM detector as set forth in claim 2, wherein said first and second detection means are pulse count detection means.

9. An FM detector as set forth in claim 1, wherein said input FM signal is a digitalized FM signal.

10. An FM detector as set forth in claim 2, wherein said input FM signal is a digitalized FM signal.

11. An FM detector as set forth in claim 3, wherein said input FM signal is a digitalized FM signal.

12. An FM detector as set forth in claim 4, wherein said input FM signal is a digitalized FM signal.

13. An FM detector as set forth in claim 7, wherein said input FM signal is a digitalized FM signal.

14. An FM detector as set forth in claim 8, wherein said input FM signal is a digitalized FM signal.

* * * * *